(12) United States Patent
Park

(10) Patent No.: US 6,436,609 B1
(45) Date of Patent: Aug. 20, 2002

(54) PHOTOLITHOGRAPHIC APPARATUS COMPOSED OF COATER/DEVELOPER AND A PLURALITY OF STEPPERS IN PARALLEL CONNECTED THERETO

(75) Inventor: Tae-sin Park, Kyungki-do (KR)

(73) Assignee: Samsung Electronics Co., Ltd., Hwasung (KR)

(*) Notice: Subject to any disclaimer, the term of this patent is extended or adjusted under 35 U.S.C. 154(b) by 0 days.

(21) Appl. No.: 09/565,629

(22) Filed: May 4, 2000

Related U.S. Application Data

(62) Division of application No. 09/136,874, filed on Aug. 19, 1998, now Pat. No. 6,239,859.

(30) Foreign Application Priority Data

Aug. 20, 1997 (KR) .............................. 97-39657

(51) Int. Cl.[7] ................................ G03F 7/00
(52) U.S. Cl. ................ 430/313; 430/311; 430/328; 430/329
(58) Field of Search ................ 430/311, 313, 430/328, 329

(56) References Cited

U.S. PATENT DOCUMENTS

| | | | |
|---|---|---|---|
| 3,748,089 A | * 7/1973 | Boyer et al. ............... | 432/52 |
| 3,839,067 A | * 10/1974 | Sosnowski et al. ......... | 427/164 |
| 5,014,208 A | * 5/1991 | Wolfson .................... | 364/468 |
| 5,024,570 A | * 6/1991 | Kiriseko et al. ........... | 414/222 |
| 5,811,211 A | * 9/1998 | Tanaka et al. .............. | 430/30 |
| 5,824,452 A | * 10/1998 | Nozaki et al. ............. | 430/313 |

FOREIGN PATENT DOCUMENTS

JP 11-74191 * 3/1999

* cited by examiner

Primary Examiner—Mark F. Huff
Assistant Examiner—Nicole Barreca
(74) Attorney, Agent, or Firm—Marger Johnson & McCollom, P.C.

(57) ABSTRACT

A photolithographic apparatus for rapidly processing semiconductor wafers. In the photolithographic apparatus, a plurality of steppers are in parallel connected to one coater/developer. The steppers are in parallel connected to one coater/developers, where the steppers process the semiconductor wafer at a low speed and the coater/developers process the semiconductor wafer at a high speed, to thereby remove a bottleneck phenomenon. Therefore, the photolithographic apparatus according to the present invention may rapidly perform a photolithography process.

11 Claims, 7 Drawing Sheets a division of Application Ser. No. 09/136,874, filed Aug. 19, 1998, now U.S. Pat. No. 6,239,859,

BACKGROUND OF THE INVENTION

1. Field of the Invention

The present invention relates to an apparatus for a photolithography process for manufacturing a semiconductor device, and more particularly, to a photolithographic apparatus in which a plurality of steppers are in parallel connected to one coater/developer.

2. Description of the Related Art

In general, a semiconductor device is manufactured through various processes. A photolithography process for transferring a micropattern to a semiconductor wafer is necessary for manufacturing the semiconductor device.

The photolithography process includes processes of coating, exposing and developing. The coating process is for forming a photoresist film on the semiconductor wafer. The exposure process is for irradiating light such as UV-ray on the photoresist film of the semiconductor wafer through the photomask after aligning semiconductor wafers where the photoresist film are formed and photomasks where micropatterns to be transferred are drawn. The development process is for developing a photoresist film of the semiconductor wafer where the exposure process is completed, to form a desired photoresist pattern.

However, a system for arranging apparatuses for performing the photolithography process is largely divided to two-types.

The one type is a stand-alone system in which a coater, a stepper and a developer are independently used without connection.

The other type is an in-line system in which one coater/developer and one stepper are in series connected.

In the stand-alone system, since flow of semiconductor wafers is not automatic, the wafer flow among the coater, the stepper and the developer must be controlled by an operator. Accordingly, the stand-alone system requires manual operation, a speed for processing the semiconductor wafers is low and the semiconductor wafers are contaminated due to particles. Thus, the in-line system is widely used to improve the efficiency of the photolithography process.

FIG. 1 shows a conventional photolithographic apparatus in which a coater/developer 10 and a stepper 20 are in series connected.

Referring to FIG. 1, the coater/developer 10 performs processes of coating and developing. The stepper 20 performs an exposure process.

FIG. 2 is a layout diagram showing an example of the conventional photolithographic apparatus of FIG. 1 arranged in a clean room.

Referring to FIG. 2, first through twenty-fourth photolithographic apparatuses are arranged in the clean room. Here, in the first photolithographic apparatus, a first coater/developer CD1 and a first stepper ST1 are in series connected, and in the second photolithographic apparatus, a second coater/developer CD2 and a second stepper ST2 are in series connected. Also, in the twenty-fourth photolithographic apparatus, a twenty-fourth coater/developer CD24 and a twenty-fourth stepper ST24 are in series connected.

At this time, the first and second wafer suppliers 50 and 60 supply first and second automatic guide vehicles 30 and 40 moving on first and second rails 70 and 80 with the semiconductor wafers, respectively. Subsequently, the first automatic guide vehicle 30 supplies one of first through twelfth photolithographic apparatuses with the semiconductor wafers through one of the first through twelfth coater/developers CD1 through CD12. Also, the second automatic guide vehicle 40 supplies one of thirteenth through twenty-fourth photolithographic apparatuses with the semiconductor wafers through one of the thirteenth through twenty-fourth coater/developers CD13 through CD24. Subsequently, the first through twenty-fourth photolithographic apparatuses expose and develop the received semiconductor wafers, and then transmit the exposed and developed semiconductor wafers to the first or second wafer suppliers 50 and 60 through the first and second automatic guide vehicles 30 and 40. At this time, the flow of the semiconductor wafers on the first and second rails 70 and 80 is controlled by first and second cell control rooms 90 and 100, respectively. Here, reference numeral 110 indicates a third cell control room for controlling the flow of the semiconductor wafers on a neighboring rail (not shown).

However, in the conventional photolithographic apparatus of FIGS. 1 and 2, since each of the steppers requires coater/developers, respectively, a space of clean room is not effectively used and excessive equipment investment cost is required. Also, since the speed of processing the semiconductor wafers in the stepper is lower than that in the coater/developer, a speed of processing wafers in the photolithographic apparatus is reduced. Further, when the stepper or the coater/developer temporarily stops operating due to defect or preventive maintenance, the operation of the photolithographic apparatus is stopped. This is because the stepper and the coater/developer are in series connected. Therefore, equipment operating rate is reduced.

SUMMARY OF THE INVENTION

It is an object of the present invention to provide a photolithographic apparatus for effectively performing a photolithography process.

Accordingly, to achieve the above object of the present invention, there is provided a photolithographic apparatus including: one coater/developer; and a plurality of steppers in parallel connected to the one coater/developer.

Preferably, the number of steppers is two through five.

According to the photolithographic apparatus of the present invention, a space of a clean room is effectively used, the number of the coater/developers is reduced, to thereby reduce equipment investment cost, and further increase a speed of processing the semiconductor wafer, and equipment operating rate is maximized.

BRIEF DESCRIPTION OF THE DRAWINGS

The above object and advantages of the present invention will become more apparent by describing in detail a preferred embodiment thereof with reference to the attached drawings in which.

DESCRIPTION OF THE PREFERRED EMBODIMENTS

Embodiment 1

Figure 1:
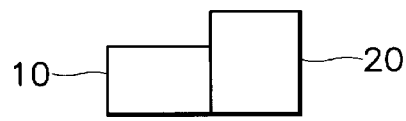
FIG. 1 shows a conventional photolithographic apparatus in which one coater/developer and one stepper are in series connected.
Figure 2:
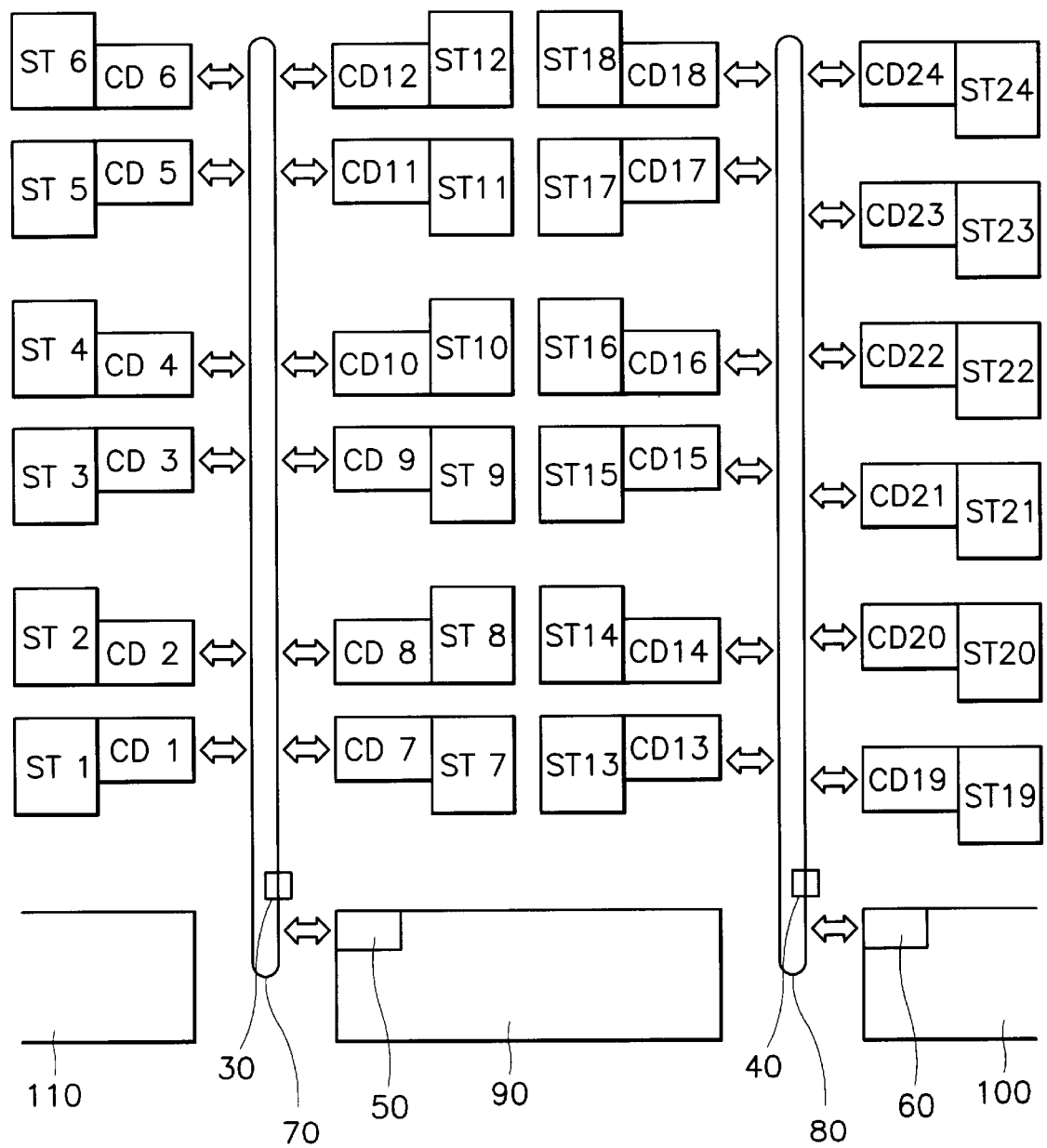
FIG. 2 is a layout diagram showing an example of the conventional photolithographic apparatus of FIG. 1 arranged in a clean room.
Figure 3:
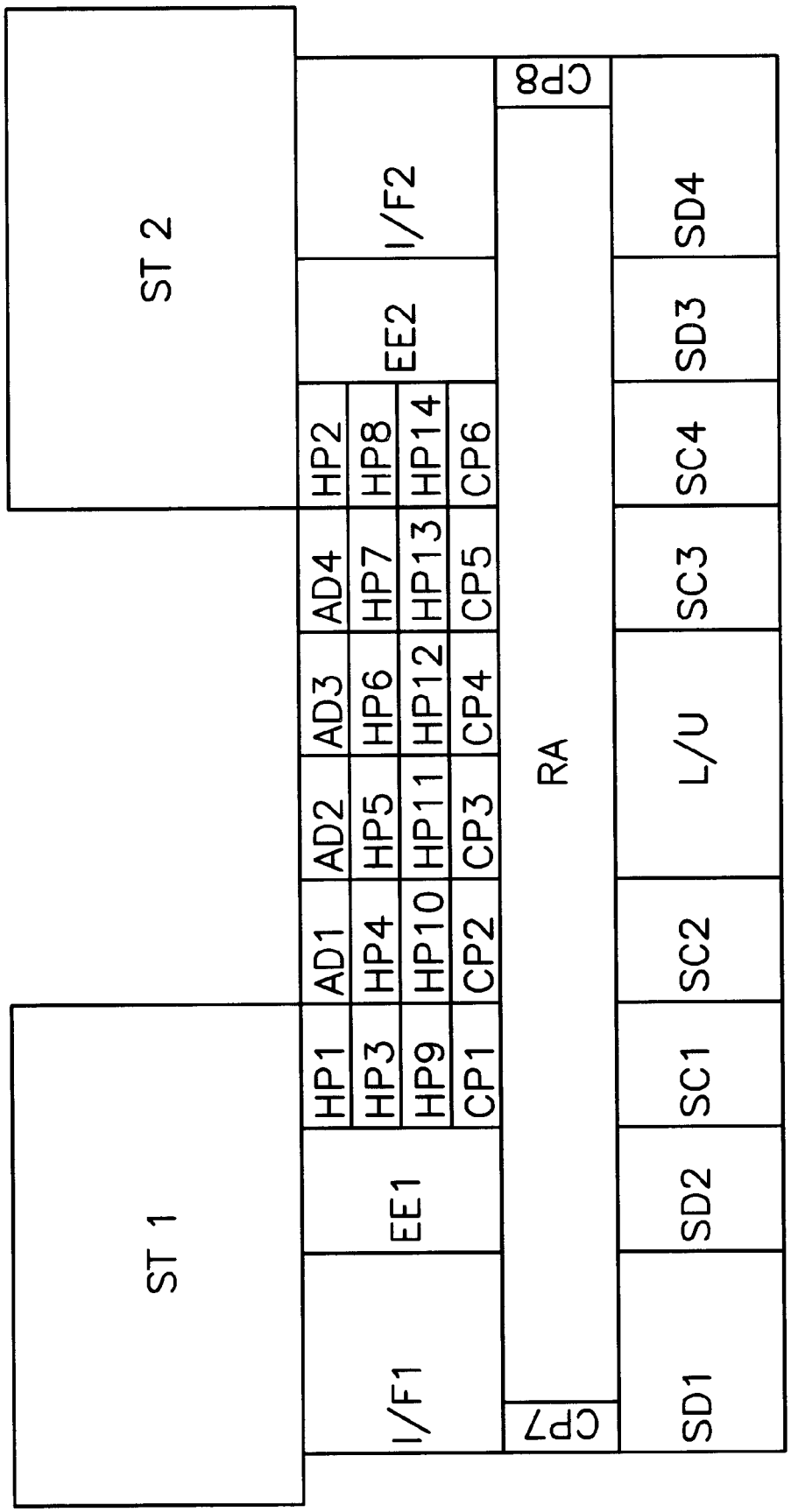
FIG. 3 shows a photolithographic apparatus in which two steppers are in parallel connected to one coater/developer according to a first embodiment of the present invention.

Referring to FIG. 3, ST1 and ST2 indicate first and second steppers, L/U indicates a loader/unloader for receiving and transmitting semiconductor wafers in which a photolithography process is completed, and AD1 through AD4 indicate first through fourth adhesion units for coating with hexamethyldisilane (HMDS) or dichlorodimethylsilane (DCDMS) to increase adhesion of the semiconductor wafer to a photoresist film.

Also, CP1 through CP8 indicate first through eighth cooling plates for cooling the semiconductor wafers, SC1 through SC4 indicate first through fourth spin coaters for coating the photoresist film on the semiconductor wafers, and HP1 through HP14 indicate first through fourteenth hot plates for soft-baking or hard-baking the photoresist film.

I/F1 and I/F2 indicate first and second interface units for temporarily standing-by the semiconductor wafers to control a process speed of the semiconductor wafers, and EE1 and EE2 indicate first and second edge exposure units for exposing only edges of the wafers to remove the coated photoresist film on edges of the semiconductor wafers.

SD1 through SD4 indicate first through fourth spin developers for developing the semiconductor wafers which have been exposed in first stepper ST1 or in the second stepper ST2 and edge-exposed in first edge exposure unit EE1 or in second edge exposure unit EE2. RA indicates a robot arm for moving the semiconductor wafers among the adhesion units AD1 through AD4, the spin coaters SC1 through SC4, the hot plates HP1 through HP14 and the spin developers SD1 through SD4.

Figure 4:
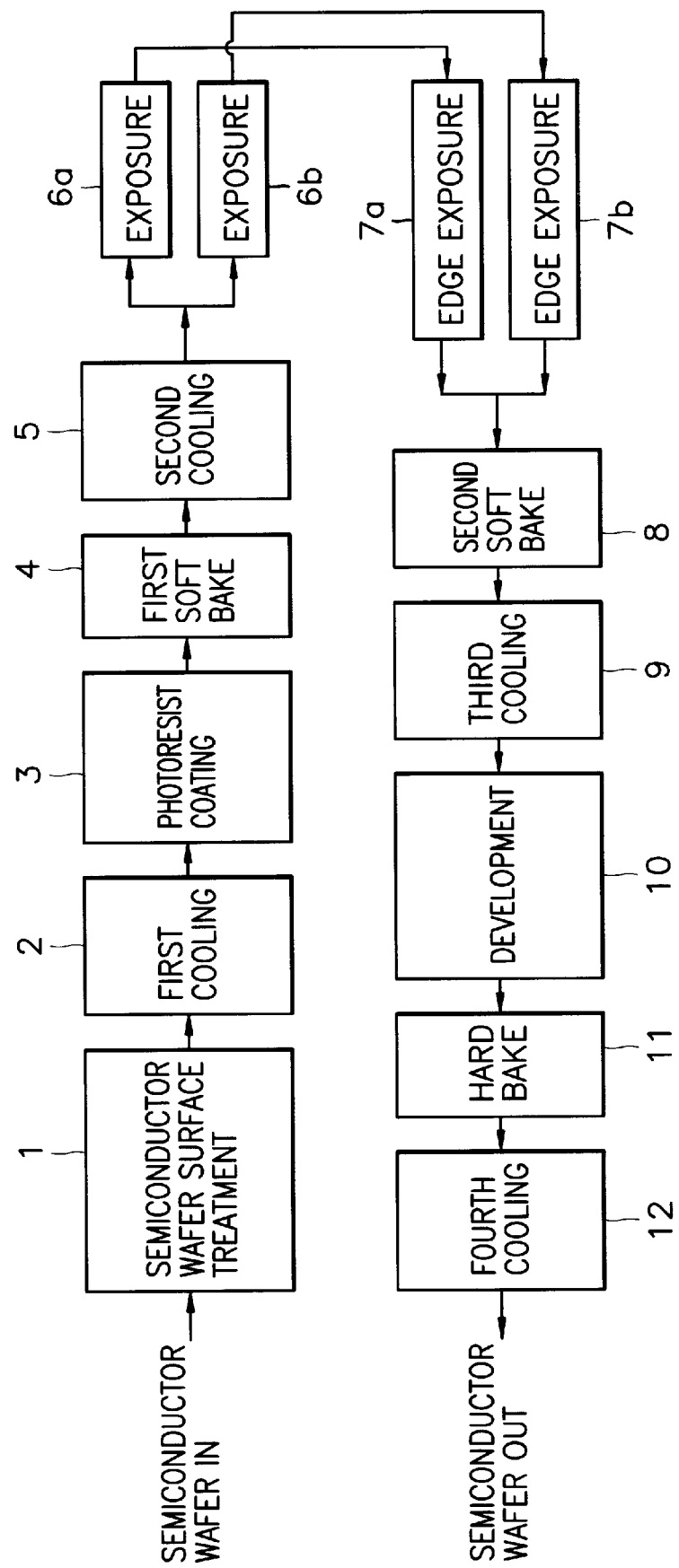
FIG. 4 is a flowchart illustrating a process of semiconductor wafers in the photolithographic apparatus of FIG. 3 according to the first embodiment of the present invention.

Referring to FIG. 4, the semiconductor wafer received to the photolithographic apparatus according to the first embodiment through the loader/unloader L/U of FIG. 3 is surface-treated at one of the first through fourth adhesion units AD1 through AD4 of FIG. 3 at approximately 100° C. with HMDS (step 1).

Subsequently, the semiconductor wafer is cooled in one of the first through eighth cooling plates CP1 through CP8 of FIG. 3 (step 2). The semiconductor wafer is coated on one of the first through fourth spin coaters SC1 through SC4 of FIG. 3, with photoresist (step 3). The semiconductor wafer coated with the photoresist is soft-baked in one of the first through fourteenth hot plates HP1 through HP14 of FIG. 3 at approximately 100° C. or less (step 4). Then, the semiconductor wafer is second-cooled in one of the first through eighth cooling plates CP1 through CP8 of FIG. 3 to a room temperature (step 5). The semiconductor wafer enters the first or second stepper ST1 or ST2 of FIG. 3 through the first or second interface unit I/F1 or I/F2 of FIG. 3. At this time, the semiconductor wafer received to the first interface unit I/F1 of FIG. 3 is exposed in the first stepper ST1 of FIG. 3 (step 6a), and the semiconductor wafer transmitted to the second interface unit I/F2 of FIG. 3 is exposed in the second stepper ST2 of FIG. 3 (step 6b). The exposed semiconductor wafer in the first or second stepper ST1 or ST2 of FIG. 3 is transmitted to the first or second edge exposure unit EE1 or EE2 of FIG. 3 through the first or second interface unit I/F1 or I/F2 of FIG. 3 to be edge-exposed. At this time, the semiconductor wafer exposed in the first stepper ST1 of FIG. 3 is edge-exposed in the first edge exposure unit EE1 of FIG. 3 (step 7a), and the semiconductor wafer exposed in the second stepper ST2 of FIG. 3 is edge-exposed in the second exposure unit EE2 of FIG. 3 (step 7b).

Subsequently, the semiconductor wafer through the first or second edge exposure unit EE1 or EE2 of FIG. 3 is secondly soft-baked in one of the first through fourteenth hot plates HP1 through HP14 of FIG. 3 at approximately 100° C. (step 8). The semiconductor wafer is thirdly cooled in one of the first through eighth CP1 through CP8 of FIG. 3 to a room temperature (step 9). Then, the semiconductor wafer is developed in one of the first through fourth spin developers SD1 through SD4 of FIG. 3 (step 10).

The semiconductor wafer is hard-baked in one of the first through fourteenth hot plates HP1 through HP14 of FIG. 3 at approximately 110° C. or more (step 11). Then, the semiconductor wafer is fourthly cooled in one of the first through eighth cooling plates CP1 through CP8 of FIG. 3 to a room temperature (step 12), and the semiconductor wafer is unloaded from the photolithographic apparatus according to the first embodiment through the loader/unloader L/U of FIG. 3.

Figure 5:
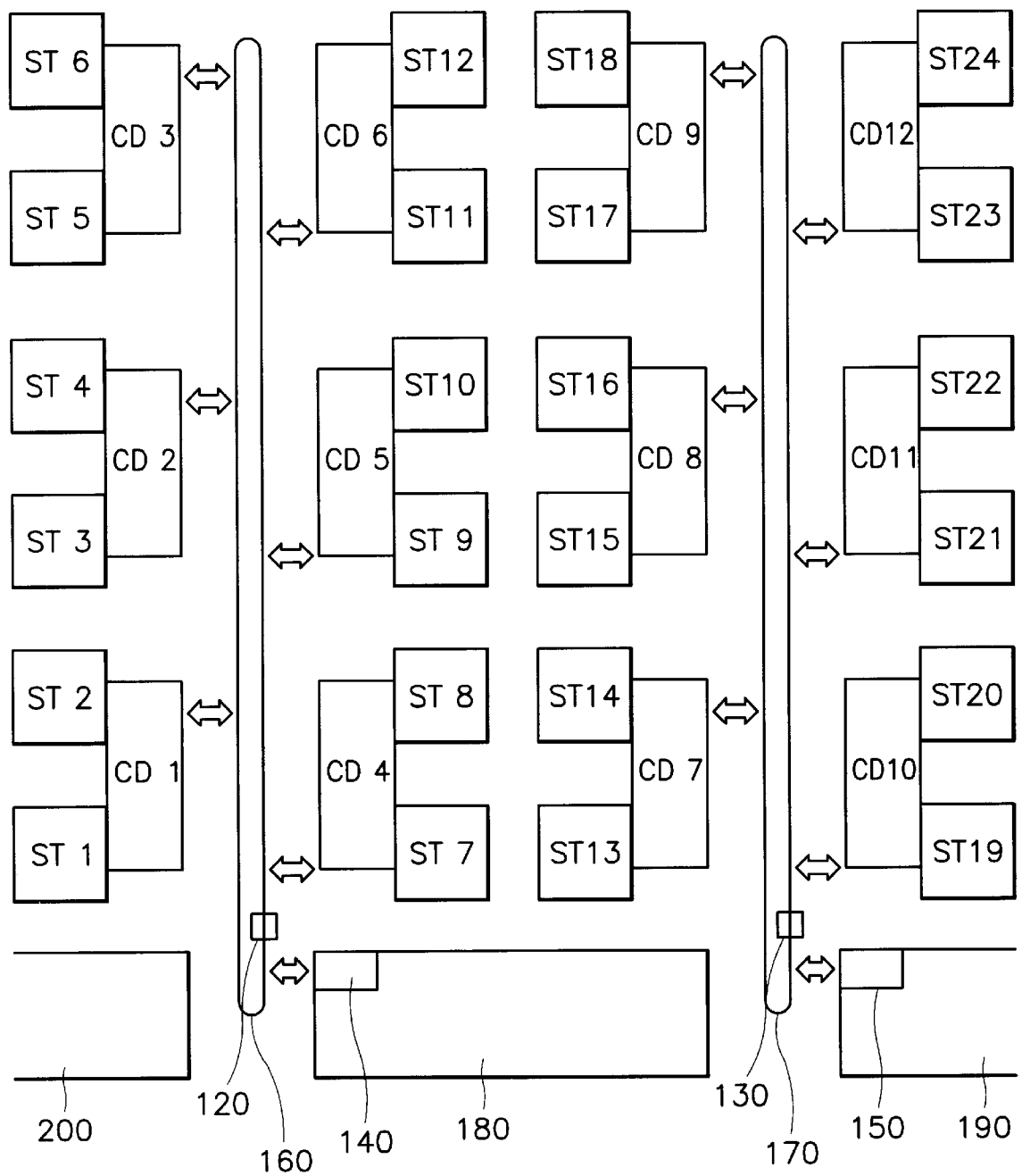
FIG. 5 is a layout diagram showing an example of the photolithographic apparatus of FIG. 3 according to the first embodiment of the present invention arranged in a clean room.

Referring to FIG. 5, first through twelfth photolithographic apparatuses according to the first embodiment are arranged in a clean room. Here, in the first photolithographic apparatus, first and second steppers ST1 and ST2 are in parallel connected in the first coater/developer CD1, and in the second photolithographic apparatus, third and fourth steppers ST3 and ST4 are in parallel connected to the second coater/developer CD2. Also, in the twelfth photolithographic apparatus, twenty-third and twenty-fourth steppers ST23 and ST24 are in parallel connected to the twelfth coater/developer CD12. Meanwhile, each structure of the first through twelfth coater/developers CD1 through CD12 is shown in FIG. 3.

At this time, the first and second wafer suppliers 140 and 150 supply the first and second automatic guide vehicles 120 and 130 moving on the first and second rails 160 and 170 with the semiconductor wafers, respectively. Subsequently, the first automatic guide vehicle 120 supplies one of the first through sixth photolithographic apparatuses with the semiconductor wafers through one of the first through sixth coater/developers CD1 through CD6. Also, the second automatic guide vehicle 130 supplies one of the seventh through twelfth photolithographic apparatuses with the semiconductor wafers through one of the seventh through twelfth coater/developers CD7 through CD12.

Then, the first through twelfth photolithographic apparatuses expose and develop the received semiconductor wafer, and then transmit the exposed and developed semiconductor wafer to the first or second wafer supplier 140 or 150 through the first or second automatic guide vehicle 120 or 130. At this time, flow of the semiconductor wafers on the first and second rails 160 and 170 is controlled by first and second cell control rooms 180 and 190. Reference numeral 200 indicates a third cell control room for controlling the flow of the semiconductor wafers on a neighboring rail (not shown).

Embodiment 2

Figure 6:
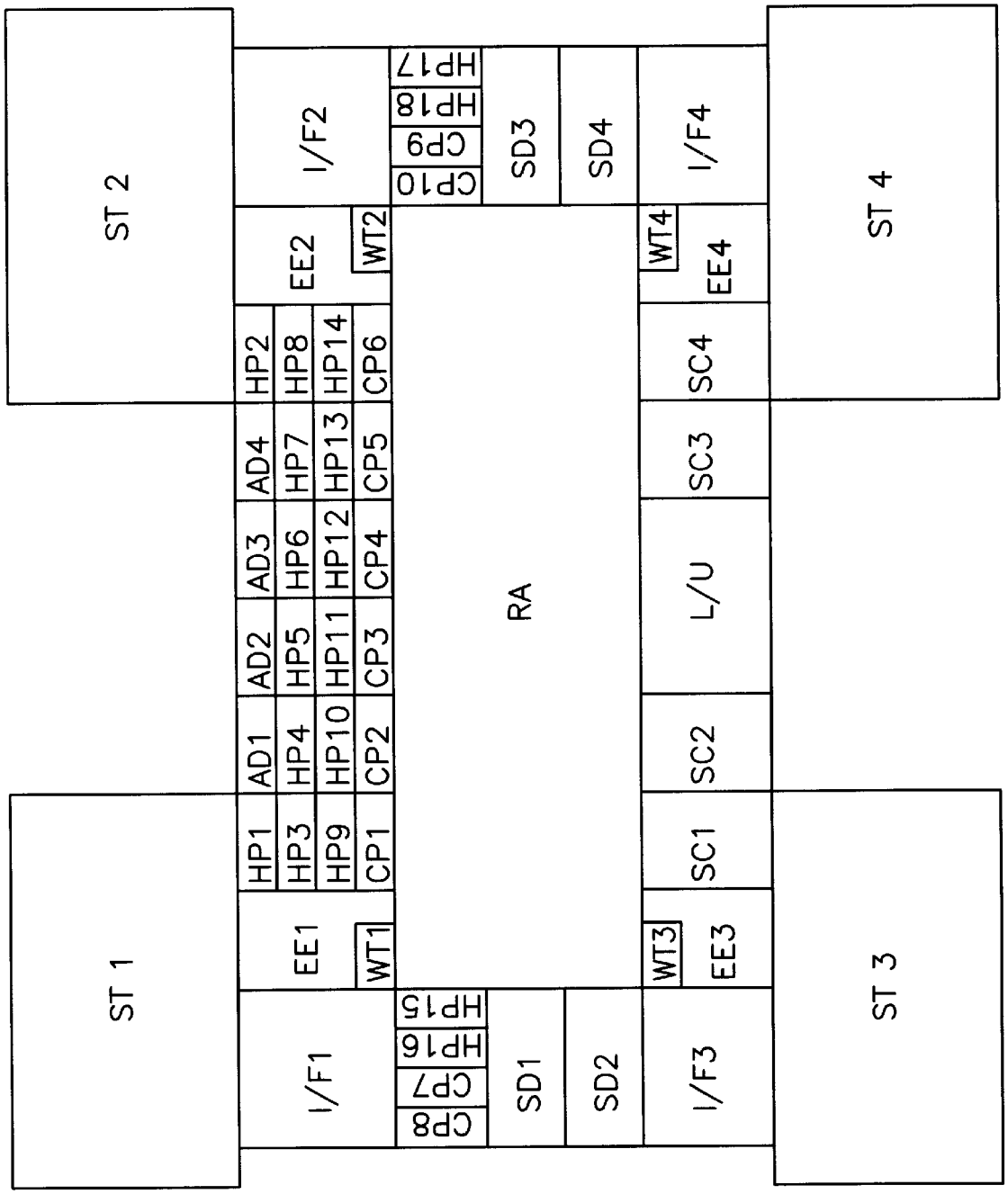
FIG. 6 shows a photolithographic apparatus in which four steppers are in parallel connected to one coater/developer according to a second embodiment of the present invention.

Referring to FIG. 6, a structure of a photolithographic apparatus in which four steppers are in parallel connected to one coater/developer will be described.

The same reference numerals as those of FIG. 3 indicate same elements. For example, reference character CP10 indicates a tenth cooling plate, reference character HP18 indicates an eighteenth hot plate, and reference character EE4 indicates a fourth edge exposure unit, respectively.

Meanwhile, reference characters WT1 through WT4 (not shown in FIG. 3)indicate first through fourth wafer transfer units WT1 through WT4 for connecting flow of semiconductor wafers between a robot arm RA and first through fourth interface units I/F1 through I/F4, where the wafer transfer units WT1 through WT4 cool the semiconductor wafer.

Figure 7:
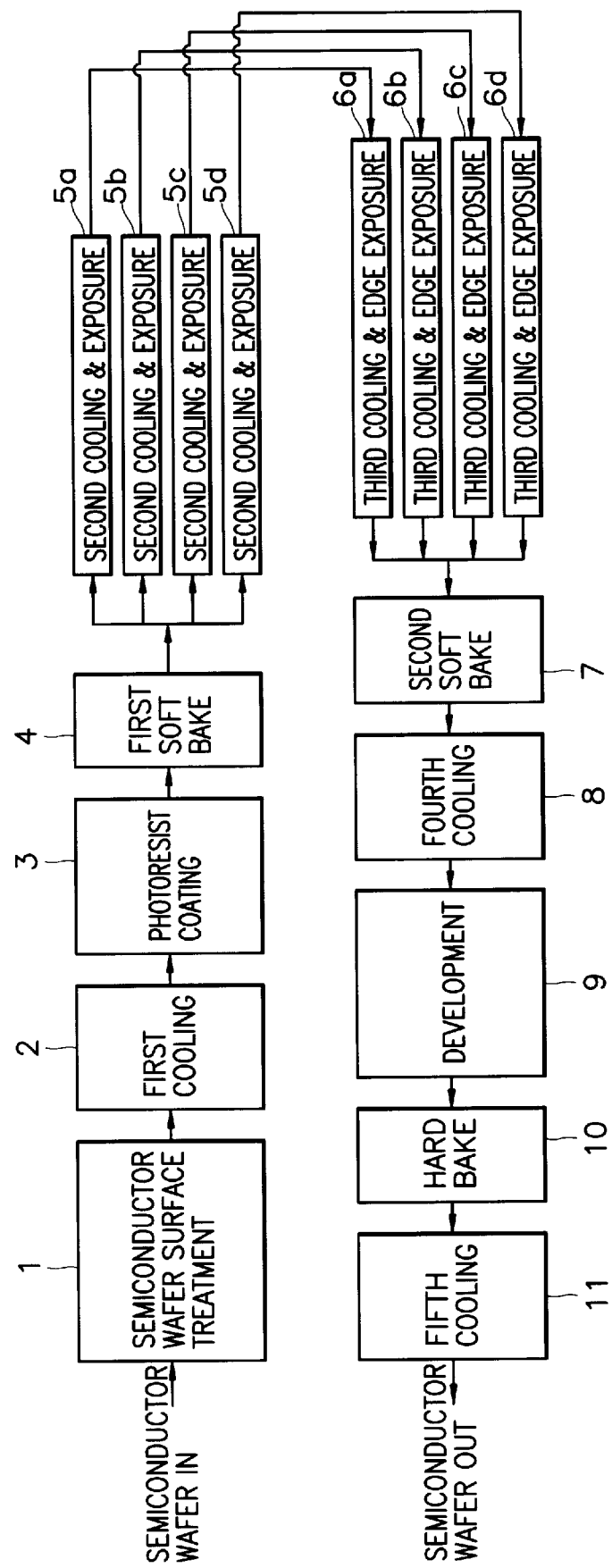
FIG. 7 is a flowchart illustrating a process of semiconductor wafers in the photolithographic apparatus according to the second embodiment of FIG. 6.

Referring to FIG. 7, a semiconductor wafer received to a photolithographic apparatus according to a second embodiment through the loader/unloader L/U of FIG. 6 is surface-treated in one of the first through fourth adhesion units AD1 through AD4 of FIG. 6 at approximately 100° C. with HMDS (step 1). Subsequently, the semiconductor wafer is first cooled in one of the first through tenth cooling plates CP1 through CP10 of FIG. 6 to a room temperature (step 2). Then, the semiconductor wafer is coated in one of the first through fourth spin coaters SC1 through SC4 of FIG. 6 with photoresist (step 3). The coated semiconductor wafer is firstly soft-baked in one of the first through eighteenth hot plates HP1 through HP18 of FIG. 6 at approximately 100° C. or less (step 4). Then, the semiconductor wafer is transferred to one of the first through fourth wafer transfer units (WT1 through WT4 of FIG. 6), and then the transferred semiconductor wafer is secondly cooled (steps 5a through 5d).

At this time, the semiconductor wafer transferred to the first wafer transfer unit WT1 of FIG. 6 is transmitted to a first stepper ST1 of FIG. 6 through a first interface unit I/F1 of FIG. 6 and the semiconductor wafer of the first stepper is exposed (step 5a), and the semiconductor wafer transferred to the second wafer transfer unit WT2 of FIG. 6 is transmitted to a second stepper ST2 of FIG. 6 through a second interface unit I/F2 of FIG. 6, and the semiconductor of the second stepper is exposed (step 5b). Also, the semiconductor wafer transferred to the third wafer transfer unit WT3 of FIG. 6 is transmitted to a third stepper ST3 of FIG. 6 through a third interface unit I/F3 of FIG. 6 and the semiconductor wafer of the third stepper is exposed (step 5c), and the semiconductor wafer transferred to the fourth wafer transfer unit WT4 of FIG. 6 is transmitted to a fourth stepper ST4 of FIG. 6 through a fourth interface unit I/F4 of FIG. 6 and the semiconductor of the fourth stepper is exposed (step 5d).

The semiconductor wafer exposed in the first stepper ST1 of FIG. 6 is transferred to the first wafer transfer unit WT1 of FIG. 6 through the first interface unit I/F1 of FIG. 6 to be third-cooled, and then edge-exposed in the first edge exposure unit EE1 of FIG. 6 (step 6a). The semiconductor wafers exposed in the second, third and fourth steppers ST2, ST3 and ST4 of FIG. 6 are transferred to the second, third and fourth edge exposure units EE2, EE3 and EE4 of FIG. 6 in the same manner as the above way (steps 6b through 6d).

The semiconductor wafers edge-exposed in one of the first through fourth edge exposure units EE1 through EE4 of FIG. 6 are secondly soft-baked in one of the first through eighteenth hot plates HP1 through HP18 of FIG. 6 at approximately 100° C. (step 7). Subsequently, the semiconductor wafers are fourth-cooled in one of the first through tenth cooling plates CP1 through CP10 to a room temperature (step 8). Then, the semiconductor wafers are developed in one of the first through fourth spin developers SD1 through SD4 of FIG. 6 (step 9).

The semiconductor wafers are hard-baked in one of the first through eighteenth hot plates HP1 through HP18 of FIG. 6 at approximately 110° C. or more (step 10). Then, the semiconductor wafers are fifth-cooled in one of the first through tenth cooling plates CP1 through CP10 of FIG. 6 to a room temperature (step 11), and then the semiconductor wafers are unloaded from the photolithographic apparatus according to a second embodiment through the loader/unloader (L/U of FIG. 6).

Figure 8:
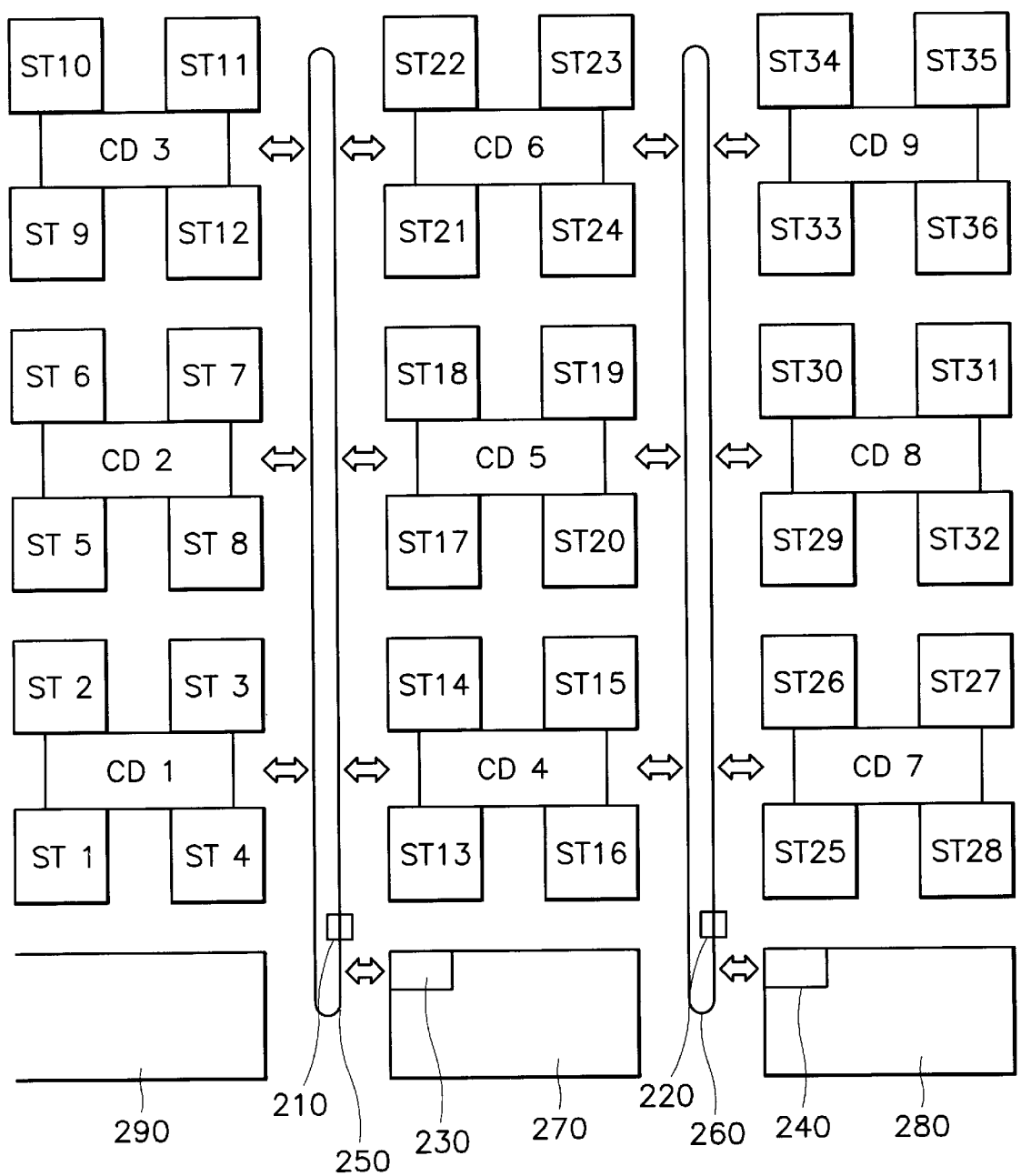
FIG. 8 is a layout diagram showing an example of the photolithographic apparatus of FIG. 6 according to the second embodiment of the present invention arranged in a clean room.

Referring to FIG. 8, first through ninth photolithographic apparatuses according to a second embodiment are arranged in a clean room. Here, in the first photolithographic apparatus, first through fourth steppers ST1 through ST4 are in parallel connected to a first coater/developer CD1, and in the second photolithographic apparatus, fifth through eighth steppers ST5 through ST8 are in parallel connected to a second coater/developer CD2.

Also, in the ninth photolithographic apparatus, thirty-third through thirty-sixth steppers ST33 through ST36 are in parallel connected to a ninth coater/developer CD9. Meanwhile, each structure of the first through ninth coater/developers CD1 through CD9 is shown in FIG. 6.

At this time, first and second wafer suppliers 230 and 240 supply semiconductor wafers to first and second automatic guide vehicles 210 and 220 moving on first and second rails 250 and 260. Subsequently, the first automatic guide vehicle 210 supplies the semiconductor wafer to one of the first through sixth photolithographic apparatuses through one of the first through sixth coater/developers CD1 through CD6. Also, the second automatic guide vehicle 220 supplies the semiconductor wafer to one of the fourth through ninth photolithographic apparatuses through one of the fourth through ninth coater/developers CD4 through CD9.

The first through ninth photolithographic apparatuses expose and develop the received semiconductor wafers, and then transmit the exposed and developed semiconductor wafers to a first or second wafer supplier 230 or 240 through the first or second automatic guide vehicle 210 or 220. At this time, the flow of semiconductor wafers on first and second rails 250 and 260 is controlled by first and second cell control rooms 270 and 280. Reference numeral 290 indicates a third cell control room for controlling the flow of semiconductor wafers on a neighboring rail (not shown).

As described above, according to the photo-lithographic apparatus of the present invention, the coater/developer required for one stepper is below one, i.e., 0.5 in the case of one coater/developer for two steppers, and 0.25 in the case of one coater/developer for four steppers , to thereby effectively use a space of the clean room, and reduce the equipment investment cost. A plurality of steppers are in parallel connected to one coater/developers, where the steppers process the semiconductor wafer at a low speed and the coater/developers process the semiconductor wafer at a high speed, to thereby remove a bottleneck phenomenon, which occurs in a conventional art. Accordingly, a speed for processing the semiconductor wafer increases. Also, even if one of the steppers temporarily stops operation due to defect or preventive maintenance, the photolithographic apparatus may normally operate using the other steppers, to thereby maximize equipment operating rate.

It should be understood that the invention is not limited to the illustrated embodiment and many changes and modifications can be made within the scope of the invention by a person skilled in the art.

I claim:

1. A photolithographic process for manufacturing semiconductor devices, comprising:

provideing a single coater for coating a photoresist film on semiconductor wafers, a single developer and a plurality of steppers, the plurality of steppers parallel-connected to said single coater and said single developer;

coating a plurality of uncoated semiconductor wafers in said single coater;

transmitting said plurality of coated semiconductor wafers to said plurality of steppers;

parallel-exposing said plurality of coated semiconductor wafers in at least two of said plurality of steppers parallel-connected to said single coater and said single developer to a photolithographic pattern; and developing said predetermined photolithographic pattern in said single developer thereby increasing the speed of said photolithographic processing of the semiconductor wafers.

2. The photolithographic process of claim 1, wherein the number of steppers is between two and five inclusive.

3. The photolithographic process of claim 1, which further includes providing a loader/unloader and receiving and transmitting semiconductor wafers employing said loader/unloader after said photolithography process is completed.

4. The photolithographic process of claim 1, which further includes the step of treating said semiconductor wafers to increase adhesion of the semiconductor wafers to a photoresist film.

5. The photolithographic process of claim 1, which further includes providing a plurality of spin coaters in addition to the single coater of claim 1 and coating the photoresist film on the semiconductor wafers in said plurality of spin coaters.

6. The photolithographic process of claim 1, which further includes the step of soft-baking or hard-baking the photoresist film.

7. The photolithographic process of claim 1, which further includes the step of edge exposing the coated semiconductor wafers which have been exposed in the steppers.

8. A photolithographic process for manufacturing semiconductor devices, comprising:

coating with a photoresist material a plurality of uncoated semiconductor wafers in a single coater;

transmitting said plurality of coated semiconductor wafers to a plurality of steppers;

exposing said plurality of coated semiconductor wafers to a photolithographic pattern in said plurality of steppers adapted to process the wafers at substantially the same time;

introducing said coated semiconductor wafers having a photolithographic pattern printed therein to a single developer; and developing said photolithographic pattern in said coated semiconductor wafers in said single developer thereby increasing the speed of said photolithographic processing of the semiconductor wafers.

9. The photolithographic process of claim 8, wherein the number of steppers is two through five.

10. The photolithographic process of claim 8, which further includes the step of soft-baking or hard-baking the photoresist film.

11. The photolithographic process of claim 8, which further includes the step of edge exposing the coated semiconductor wafers which have been exposed in the steppers.

* * * * *

UNITED STATES PATENT AND TRADEMARK OFFICE
CERTIFICATE OF CORRECTION

PATENT NO. : 6,436,609 B1
DATED : August 20, 2002
INVENTOR(S) : Tae-sin Park

It is certified that error appears in the above-identified patent and that said Letters Patent is hereby corrected as shown below:

Column 7,
Line 26, "said predetermined photolithographic" should read
-- said photolithographic --.

Signed and Sealed this

Seventeenth Day of December, 2002

JAMES E. ROGAN
*Director of the United States Patent and Trademark Office*